United States Patent
Langari

[19]

[11] Patent Number: 6,134,110
[45] Date of Patent: Oct. 17, 2000

[54] COOLING SYSTEM FOR POWER AMPLIFIER AND COMMUNICATION SYSTEM EMPLOYING THE SAME

[75] Inventor: Abdolreza Langari, Garden Grove, Calif.

[73] Assignee: Conexnant Systems, Inc., Newport Beach, Calif.

[21] Appl. No.: 09/170,029

[22] Filed: Oct. 13, 1998

[51] Int. Cl.[7] .................................................... H05H 7/20
[52] U.S. Cl. .......................... 361/700; 174/16.3; 361/719
[58] Field of Search .................. 165/80.2, 80.4, 165/104.33; 174/15.2; 361/687, 700–701, 704, 707, 719, 720; 343/853

[56] References Cited

U.S. PATENT DOCUMENTS

| | | | |
|---|---|---|---|
| 5,095,404 | 3/1992 | Chao ........................................ | 361/700 |
| 5,099,254 | 3/1992 | Tsukii et al. ............................. | 343/853 |
| 5,513,070 | 4/1996 | Xie et al. ................................. | 361/700 |

FOREIGN PATENT DOCUMENTS

| | | |
|---|---|---|
| 61032602 | 2/1986 | Japan . |
| 61285828 | 12/1986 | Japan . |
| 62036904 | 2/1987 | Japan . |

OTHER PUBLICATIONS

Thermacore, Inc.'s Website Article "Heat Pipe Technology", undated.

Thermacore, Inc.'s Website Article "Common Questions About Heat Pipes", Oct. 4, 1997.

Thermacore, Inc.'s Website Article "Notebook Computer Applications—Pentium Processor Thermal Management Systems", undated.

Langari Abdolreza et al: "Cooling solution for power amplifer modules in cellular phone applications", Proceedings of the 1999 49th Electronics Components and Technology Conference (ECTC), San Diego, CA, USA, Jun. 1–4, 1999, pp. 316–320.

Xjie H. et al: "Thermal solutions to Pentium processors in TCP in notebooks and sub–notebooks", 1995 Proceedings, 45th Electronic Components and Technology Conference (Cat. No. 95C3582–0), 1995 Proceedings, 45th Electronic Components and Technology Conference, Las Vegas, NV, USA, May 21–24, 1995, pp. 203–208, figures 4,5,15,17.

*Primary Examiner*—Gregory Thompson
*Attorney, Agent, or Firm*—Foley & Lardner

[57] ABSTRACT

The invention discloses an apparatus for cooling semiconductors which are mounted on substrates for the purpose of packaging. In some electronic packaging methods semiconductor dies are mounted on substrates instead of being encapsulated and mounted individually on circuit boards. This method can be beneficial from both cost and manufacturing standpoints but can lead to problems when semiconductor power chips on the substrate generate enough heat to cause excess heating of themselves and adjacent chips on the substrate. The invention discloses several methods of removing heat from the power chips in order to minimize the temperature within the semiconductor die and to minimize the conduction of heat to other devises mounted on the substrate. The invention involves using thermal vias (thermally conducting pathways) embedded in the substrate and circuit board on which the substrate sits to conduct heat from the semiconductor and away from the substrate. The invention also includes conducting heat using heat pipes connected to the thermal vias to conduct heat away from the chips and substrate and into surrounding structures.

13 Claims, 6 Drawing Sheets

COOLING SYSTEM FOR POWER AMPLIFIER AND COMMUNICATION SYSTEM EMPLOYING THE SAME

FIELD OF THE INVENTION

The present invention relates, generally, to portable devices and communications systems and process which use power amplifiers, and, in particular embodiments to such personal electronics systems, processes and devices which minimize temperature rise within power circuitry by minimizing thermal resistance to heat transfer from power circuitry.

DESCRIPTION OF THE RELATED ART

Portable electronic devices have become part of many aspects of personal, business, recreational and other activities and tasks. As the popularity of various portable electronic devices, for example personal communications devices such as portable phones, portable televisions, and personal pagers, increases, the demand for smaller, lighter, more powerful, and more power efficient electronics also increases.

Amplification of electronic signals is a function performed in many modern electronics communication systems. Amplification circuitry and devices tend to generate significant amounts of heat. However the packaging of these devices, especially within systems that have small form factors, tends to reduce the ability of these devices to dissipate heat through convection. The space surrounding these devices has also become significantly more confined as packaging sizes shrink, thereby reducing the opportunity for convection currents to circulate and remove heat. The packaging of these devices is being made, in significant part, of materials such as plastics, which are generally lighter than metal packaging. Plastics generally tend to have a greater thermal resistance to heat transfer, relative to metals. The opportunity for heat transfer, therefore, and thereby the cooling of the power amplifiers via conduction, may be significantly reduced by the increasing use of non metallic materials.

Some manufacturers of power devices have taken the approach of adding metal heat sinks to their power devices. Because the effectiveness of the heat sinking diminishes, however, with the air volume available for convection cooling surrounding the heat sink, the reduction of volume in the smaller electronic packages reduces the effectiveness of this technique. Some manufacturers utilize power devices which can stand higher temperatures but, as the space between the power devices and other electronic circuitry decreases as packages become smaller, the heating of the adjacent devices increases which may tend to increase dissipation and reduce reliability.

Manufacturers in the related field of portable computers, have, in some cases developed a more direct approach to heat removal as the demand for smaller, thinner, lighter, and more powerful portable computer units has increased. The demand for a more direct approach for heat removal has been necessitated by the increasing heat dissipation of microprocessors due to a variety of factors such as increasing die size, and increasing clock frequency.

Many of the constraints of the portable computer field are similar to that of personal communications field. In both the need to conserve power to extend operating time is a significant consideration and so in both portable computers and personal communications devices, it is desired that the cooling means not be electrically powered, in order to conserve energy. In both, it is also commonly desired that any cooling method be light weight, that it work in any orientation, and that it be physically small enough to fit within current packaging. The cooling system must also be achievable at a price that would not be cost prohibitive.

To meet these constraints heat pipes have been employed. A prime example of the use of heat pipe technology is produced by Thermacore, Inc. of Lancaster Pa. which has produced a heat pipe solution for notebook computers. This product was an "EE Product News" product of the year for 1995. This type of product contains a heat pipe as part of a cooling system being used to cool a chip such as a Pentium™ processor chip used in a portable computer. In this type of product the cooling is achieved by thermally connecting the heat source, in this case a microprocessor chip, with a mechanism which can dissipate the heat. The heat flows from the microprocessor into a heat pipe, which it is thermally connected to the microprocessor, and then into an area that can radiate or absorb the heat. A thermal connection, to the heat pipe or otherwise need not be a a physical surface to surface connection. It may employ electrically isolating, yet thermally conducting barriers, thermal grease, or other techniques well known in the art.

A heat pipe is an unpowered, partially evacuated, sealed, heat transfer device with significant thermal conductivity. Heat pipes may exist in a wide variety of configurations, a popular one being cylindrical and containing a small quantity of working liquid such as water, acetone, methanol or a variety of other fluids. Heat pipes work through the evaporation and condensation of the working fluid. A generalized cut away representation of an example heat pipe is shown in FIG. 1. With reference to FIG. 1, the example heat pipe 101 contains an outer tube 103, and a concentric inner tube 105. Between the inner tube and the outer tube is the wick 107. As heat enters the tube at the heat input, or evaporator end 123 of the heat pipe the working fluid at the evaporator end of the inner tube 109 evaporates creating a pressure gradient within the tube. This pressure gradient causes the working fluid to flow, as shown by directional arrows 113, and 115 to the condenser end of the inner tube 111. At the condenser end of the inner tube the fluid condenses releasing heat which travels out the heat output or condenser end 125 of the heat pipe. The liquid working fluid then is absorbed through the porous wall of the inner tube and the capillary action of the wick 107, causes the working fluid to flow, as shown by directional arrows 117, 119, and 121, back to the evaporator end, where the process begins again. Well designed heat pipes can have thermal conductivity from 10 to 10,000 times the effective thermal conductivity of copper. depending on the length of the heat pipe.

SUMMARY OF THE DISCLOSURE

Accordingly, preferred embodiments of the present invention are directed to heat removal from circuits that dissipate a significant amount of power, such as communication devices, and systems employing the same. Embodiments described herein remove heat from the power dissipating circuits through the use of various configurations which employ a heat pipe as an element of the embodiment.

A heat removal system, according to a preferred embodiment of the invention, conducts heat from power dissipating PA-MCM (power amplifier multichip module) via a heat pipe to a suitable heat sinking structure within a portable phone, preferably the antenna.

In another preferred embodiment heat is removed from a PA-MCM (power amplifier multichip module) through the use of thermal vias (pathways) embedded in the substrate of the PA-MCM, which are in thermal contact with thermal vias on a circuit board, which itself is in turn in contact with an evaporator end of a heat pipe for the removal of the heat.

PA-MCM modules may be present in a variety of applications including, but not limited to, GSM phones and PCS amplifiers. Those skilled in the art will appreciate that MCM modules need not contain a power amplifier, or more than one semiconductor die to benefit from embodiments of the invention.

Another embodiment discloses heat removal from a PA-MCM through the use of thermal vias (pathways) embedded in the substrate of PA-MCM which in turn are in direct contact, through a hole in a circuit board, with the evaporator end of a heat pipe for the removal of the heat.

DETAILED DESCRIPTION OF PREFERRED EMBODIMENTS

Embodiments of the present invention relate, generally, to power dissipation within portable communication systems, to devices which dissipate power, and processes which affect power dissipation within those systems.

Power amplification devices, and devices which dissipate significant amounts of power, according to embodiments of the invention, may be employed in a variety of portable electronic systems. Thus, embodiments of the invention may involve various portable communication systems. However for the purposes of simplifying this disclosure, preferred embodiments, are described herein with relation to personal communications systems, such as portable phones, wireless phones, two way radios and the like. Such communication systems typically include one or more portable units which transmit and/or receive from one or more remotely located transmitter and/or receivers. In many portable communications applications it is desirable to minimize size and weight to increase portability, and to reduce the ambient temperature of internal electronics, for example, to minimize power dissipation and to increase reliability.

Figure 2:
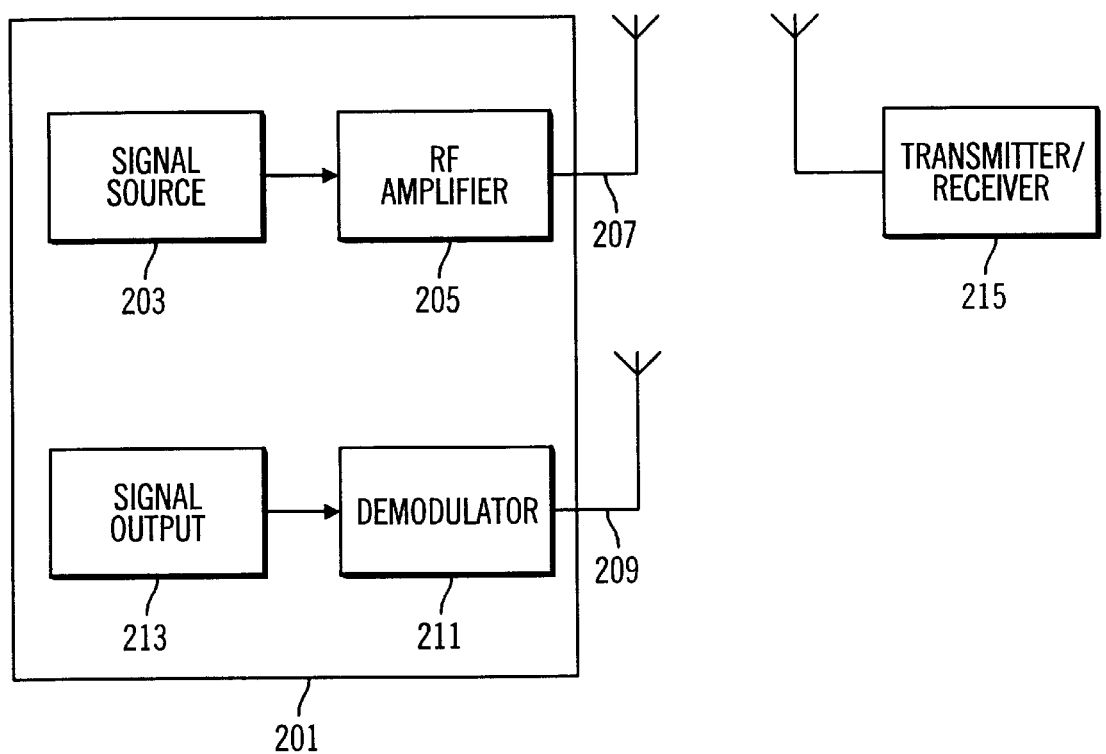
FIG. 2 is a generalized block diagram representation of a communication system environment of an embodiment of the present invention.

A generalized representation of a communication system environment of an embodiment of the present invention is shown in FIG. 2, wherein a portable communication system 201 includes a signal source 203 coupled to an RF (radio frequency) amplifier 205, which is in turn coupled to a transmission antenna 207 for the purpose of broadcasting the signal via radio transmission. A portable communication system 201 also includes a receiving antenna 209 for the reception of signals, coupled to a demodulator 211 which will transformn the signal into a suitable formnat to be output in a signal output unit 213. The antennae may be separate or combined into one antenna unit. A portable communication unit 201 communicates via radio signals to a transmitter/receiver of another communications unit 215. A signal source unit 203 may be used to input various signals such as, but not limited to, voice signals and digital data from computers and other electronic devices.

Figure 3:
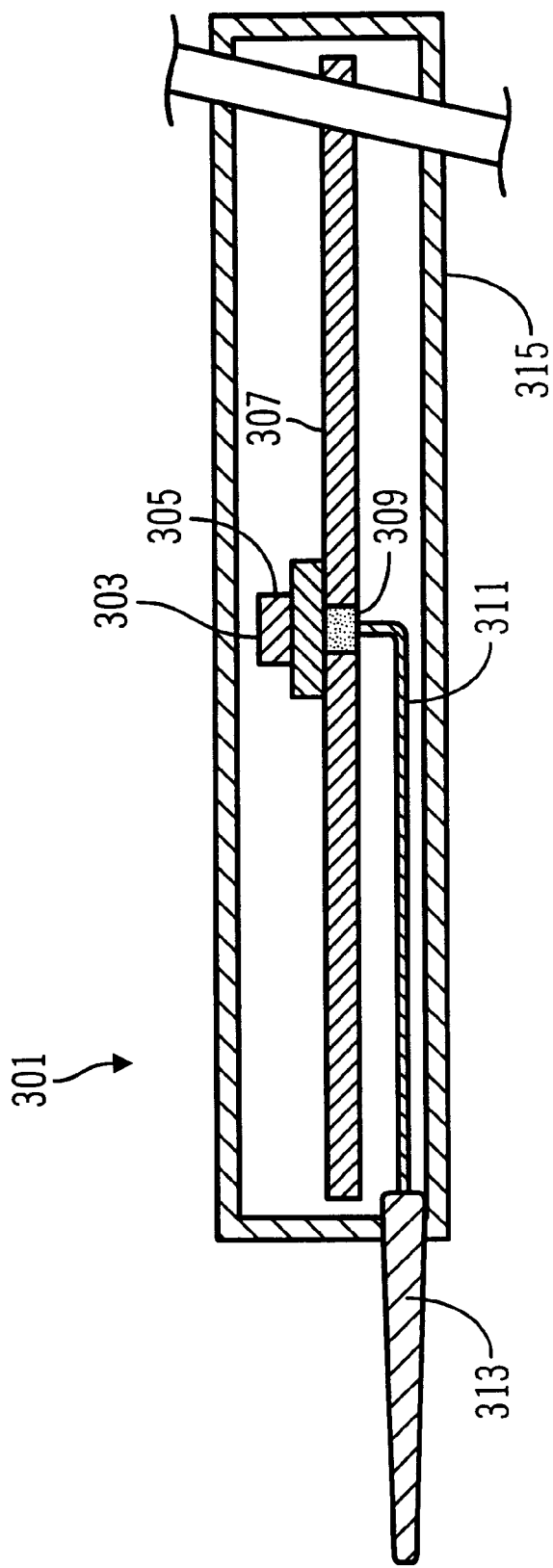
FIG. 3 shows a cross section view of a personal communication device according to an example embodiment of invention.

A first example of an embodiment of the invention comprises a portable phone device 301 as in FIG. 3 shown in cross section. A power amplifier device die (semiconductor chip) 303 is mounted on a multichip module substrate 305. Multichip modules may be used as a packaging mechanism for multiple semiconductor dies. Instead of being packaged individually, multichip modules comprise multiple semiconductor dies packaged by mounting on a common substrate. Individual connections between the semiconductor device dies thus mounted can be made on the common substrate, thereby eliminating the need for making the connections elsewhere. The substrate, 305, is commonly referred to as a multichip carrier module (MCM), when it is used to mount more than one semiconductor chips, and is commonly referred to as a PA-MCM when the MCM contains a power amplifier mounted on the substrate. It will be understood that further embodiments of the invention may be applied to single die configurations. MCMs may mounted on a circuit board 307, which is a common fiberglass circuit board in the present embodiment, but can be other types as is well known in the art in other embodiments.

A power amplifier die dissipates a significant amount of heat when powered and in use. When other semiconductor devices are included on a MCM with a power amplifier die, the heat dissipated can cause a significant rise in the temperature of all devices mounted on the MCM substrate. In one embodiment the heat is conducted away from the device into the antenna which provides a thermal sink as shown in FIG. 4.

Figure 4:
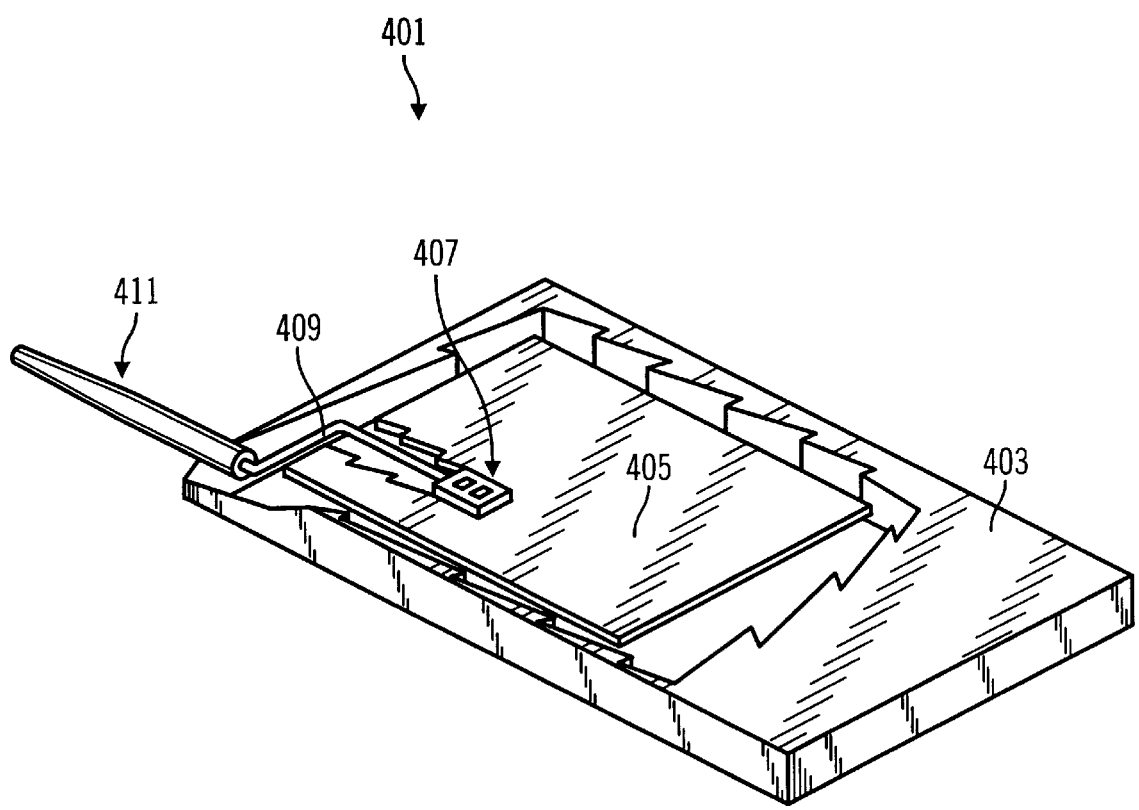
FIG. 4 is a cutaway view of a personal communication device, according to an example embodiment of invention, showing a heat pipe connecting an MCM to an antenna of the personal communication device.

FIG. 4 is a cutaway view of a personal communication device 401. The circuit board 405 within the device, on which multichip module 407 is mounted, is shown cut away to illustrate a heat pipe 409 coupling the multichip module, 407, to the antenna 411 of the device.

In a further embodiment, in order to conduct heat away from the other components, a thermal via (pathway) 309 in the circuit board is provided. The thermal via 309 is located below the position of the power amplifier die 303 and comprises a thermally conductive element, for example a plated through section of the circuit board, for the purpose of conducting the heat dissipated by the power amplifier die out of the power amplifier die and away from the other chips mounted on the MCM.

Some manufacturers will deposit an area of copper on a circuit board for the purpose of radiating heat away from a dissipating device such as a power amplifier. This technique is of limited effectiveness in various including small portable devices, wherein the circuit board area is a limited resource and devoting circuit board area primarily to radiate heat can increase the size of the board. Even if a significant amount of area of the circuit board could be dedicated to serve as a radiator for device heat, it would be of reduced effectiveness because the space around the circuit board is small, typically surrounded by an insulating plastic case, leaving little room for heat removal through radiation or convection. In the present embodiment, heat is conducted away from the amplifier die 303, through the substrate 305, through the thermal via 309 and into a heat pipe 311. The heat pipe 309 then further conducts heat into the antenna.

Figure 1:
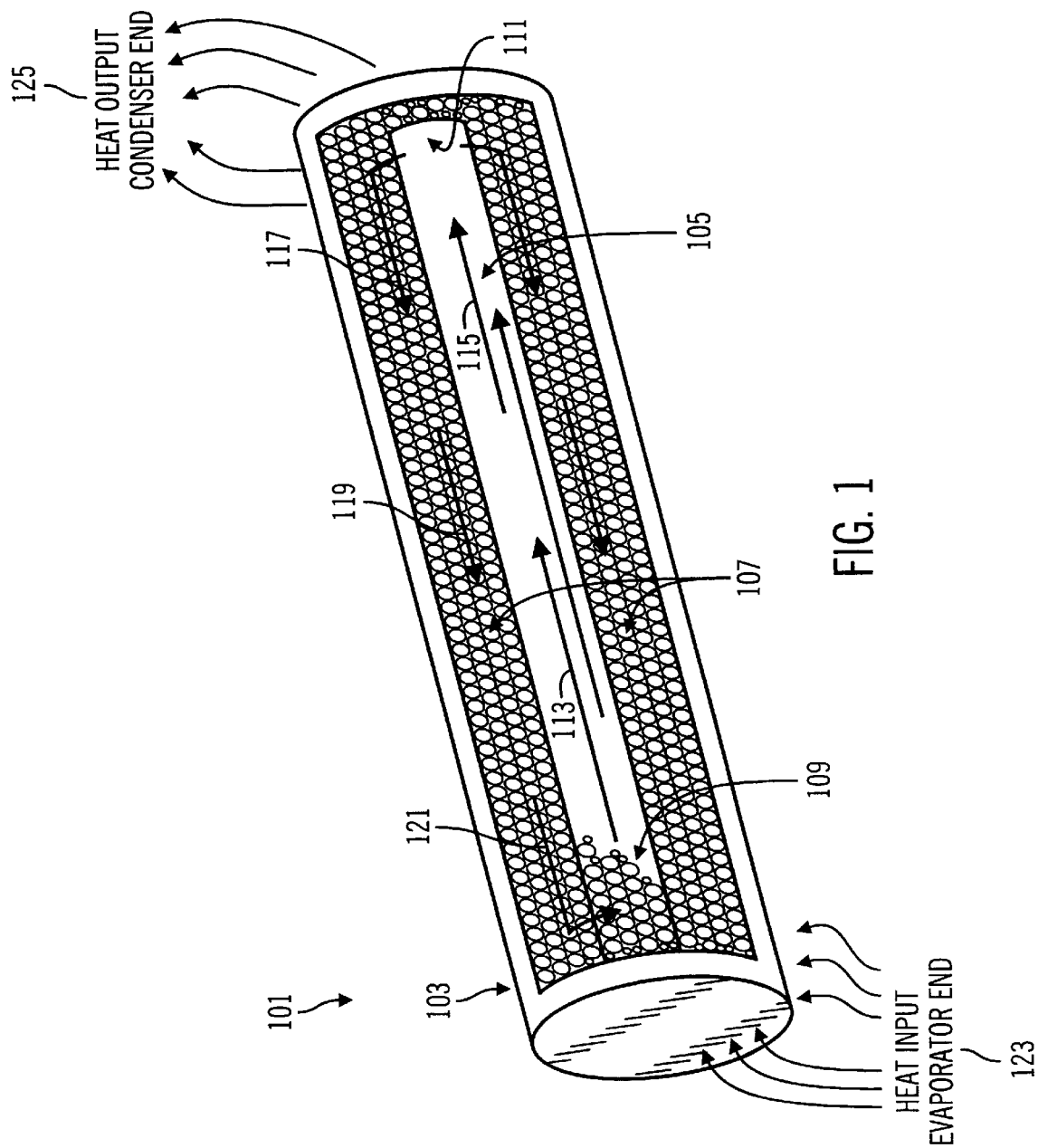
FIG. 1 is a generalized cut away view of an example of a typical heat pipe.

Heat pipe 311 may comprise a heat pipe structure as described above with respect to FIG. 1. Alternatively, other suitable heat pipe structures may be employed. The heat pipe 311 preferably contains a heat disipating fluid, such as, but not limited to those described above with respect to FIG. 1. The heat pipe 311 conducts the heat away from the die 303, and into a suitable structure for the dissipation of the heat such as, in preferred embodiments, the personal communication device's antenna. For a variety of reasons the antenna can be a particularly suitable structure for the dissipation of heat. It can be made of metal and may present a suitable thermal sinking capacity. The antenna may protrude from the device thereby providing a convenient path to radiate heat into the environment. In such a case where the antenna protrudes it can provide, not only a source of radiation cooling, but also a source of convection cooling as localized air currents impinge upon it.

Figure 5:
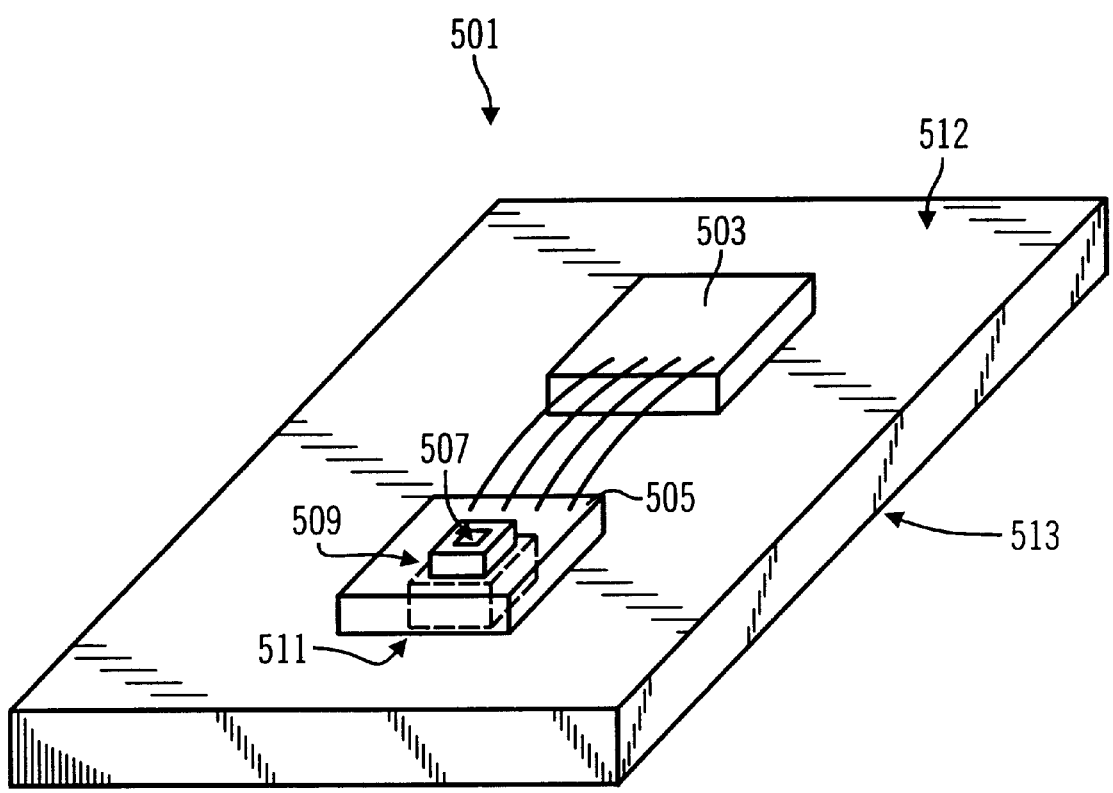
FIG. 5 is an example of a MCM (multichip module) that may be used with a preferred embodiment of the invention.

FIG. 5 shows a multichip module that may be used with a further embodiment of the invention. As will be appreciated by one skilled in the art such multichip modules may contain a variety of dies or as few as a single die. The illustrated multichip module contains a power amplifier die 505 and a control circuit die 503, both mounted on the top surface 512 of a common substrate 501. In use, in this embodiment, the substrate is mounted with its lower surface 513 in contact with a circuit board. The power amplifier die in the present embodiment is a Gallium Arsenide GaAs type that is used for power amplification purposes in portable phones. Within the power amplifier die 505 is a section of GaAs power circuitry 507. Gallium Arsenide type devices are often used in communications and other high frequency applications because of their high frequency response capability. Gallium Arsenide power devices can exhibit "hot spots". Hot spots develop when specific areas of the semiconductor devices dissipate a disproportionate amount of the overall power of the device. Hot spots can limit the safe operating characteristics of the device and hence the power output of the devices, which could otherwise exhibit a higher output if not for the heat concentration developed within the hot spot.

In the present embodiment, associated with the GaAs power circuitry 507 is a hot spot 509 representing the volume within the die 505 in immediate proximity to the power circuitry 507 where the heat dissipated by the circuitry is most concentrated. Immediately beneath the hot spot 509, within the substrate and penetrating the width of the substrate, is a volume of thermally conductive material 511 platd in direct thermal contact with the hot spot 509. This thermal via (pathway) within the substrate is aligned with and located adjacent to the hot spot 509, so that its placement may effectively conduct heat away from the hot spot, serving to reduce the temperature of the hot spot, thus minimizing the amount of heat conducted into the substrate 501 and thereby into the controller die 503 mounted on the same substrate.

Figure 6:
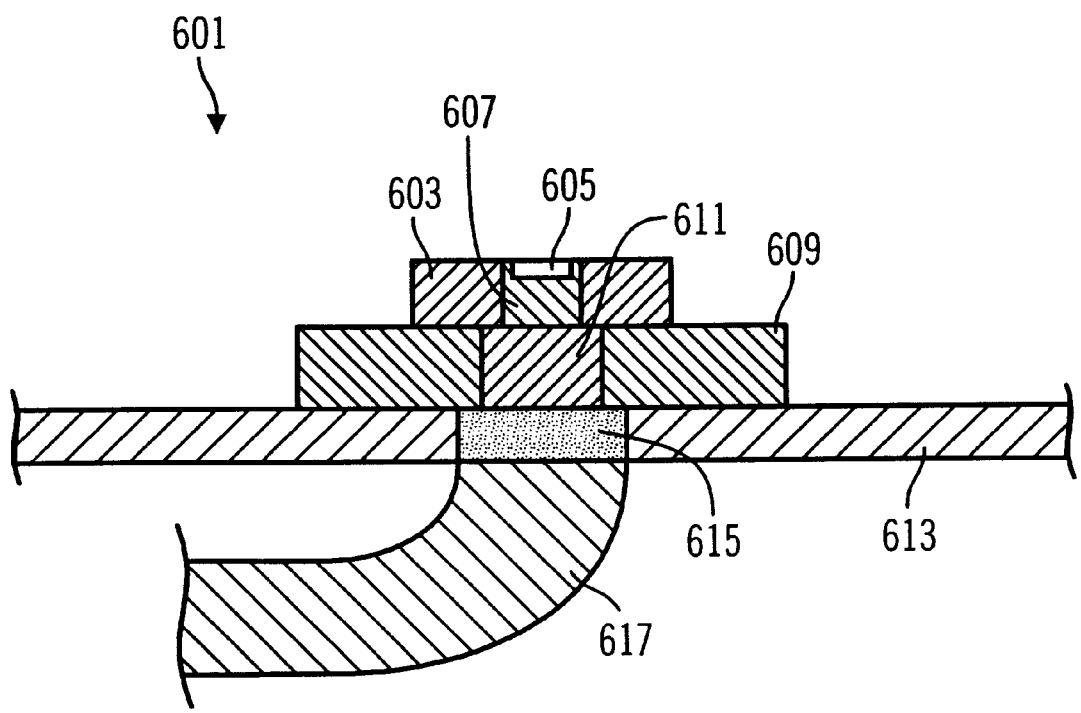
FIG. 6 is a cross section view of a circuit board containing a MCM as it is used in one of the preferred embodiments of the invention.

FIG. 6 is a side, cross sectional view, showing the same MCM as in FIG. 5 with the power amplifier chip and hot spot cross section. Additional features that may be included in further embodiments of the invention are also presented. The power amplifier die 603 is mounted on the MCM substrate 609. Power circuitry 605 within the amplifier die generates the hot spot 607 in immediate proximity to the power circuitry 605. The substrate 609 contains a thermal via 611, which comprises a material that is more thermally conductive than the substrate material, The power amplifier die 603 is situated so as to align and position position the hot spot of the power amplifier circuitry directly adjacent the thermal via 609. Such placement maximizes the amount of heat that may be conducted away from the hot spot 607 by the thermal via 611. The thermal via 611 is aligned and positioned so as to be in contact with a second thermal via 615 which is located within the circuit board 613. The thermal via in the circuit board 615 is positioned so that the thermal via in the substrate 611 is in thermal contact with it in order to maximize the thermal conductivity between the vias.

The circuit board via is made from a material which is more thermally conductive than the circuit board which contains it. In the illustrated embodiment the circuit board via comprises plated through copper and the circuit board comprises common circuit board fiberglass. As may be appreciated by one skilled in the art, the fiber glass circuit board and the plated through copper circuit board via is selected merely as a common example likely to be familiar to those skilled in the art. A variety of other materials may be employed without departing from the invention. Directly beneath the circuit board is located the evaporation end of a heat pipe 617. The heat pipe 617 is aligned and positioned so as to be in thermal contact with the circuit board thermal via, in order to maximize thermal transfer between the circuit board via 615, and the heat pipe 617. Correct positioning of the power amplifier die, 603 with respect to the substrate thermal via 611 will maximize the transfer of heat from the hot spot 607, to the substrate thermal via 611. Further correct positioning of the substrate via 611, with respect to the circuit board thermal via 615, and the circuit board thermal via 615, with respect to the heat pipe evaporation end will maximize the overall thermal transfer, thereby maximizing the transfer of heat away from the power amplifier die 603 and away from any other components on the substrate.

The above described embodiment's are merely representative examples and are not intended to limit the invention to the specific disclosed structure. Indeed, a significant number of variations that may be envisioned by one skilled in the art without departing from the invention. For example, in a further embodiment the circuit board via might be eliminated entirely and the heat pipe placed in direct contact with the substrate via. The heat pipe might also be inserted into a cavity disposed within the substrate for the purpose of coupling to the heat pipe, or the heat pipe could contact the power amplifier die from above with some sort of holding mechanism to secure it in place.

It may also be appreciated by one skilled in the art that the end of the heat pipe, distal to the connection with the circuit board thermal via, might be disposed in a variety of manners in order to conduct heat opportunistically into such structures as a particular embodiment's design limitations might present.

I claim:

1. An apparatus for conducting heat from semiconductors in portable communications equipment having an antenna, the apparatus comprising:

a semiconductor die from which heat is to be conducted;

a substrate for mounting semiconductor dies thereon having a first side and a second side, the semiconductor die being coupled to the first side of the substrate;

a heat pipe having an evaporator end and a condenser end, the evaporator end being thermally coupled to the substrate through a thermally conductive pathway for the purpose of conducting heat from the semiconductor die into the heat pipe; and the heat pipe having a condenser end coupled to an antenna for the purpose of conducting heat from the heat pipe into the antenna.

2. An apparatus as in claim 1 wherein the thermally conductive pathway comprises: a thermal via within the substrate upon which the semiconductor die is mounted, the thermal via being of lower thermal resistance than the surrounding substrate and being disposed between the semiconductor die and the evaporator end of the heat pipe.

3. An apparatus as in claim 2 wherein the semiconductor die is a gallium arsenide semiconductor die.

4. An apparatus as in claim 3 wherein a hot spot on the gallium arsenide die is positioned in so as to be in thermal contact with the substrate via for the purpose of maximizing the conduction of heat from the hot spot.

5. An apparatus for conducting heat from a semiconductor die mounted on a substrate, the apparatus comprising:

a semiconductor die from which heat is to be conducted;

a substrate for mounting at least one semiconductor die on, the substrate having a first side and a second side, the semiconductor die being coupled to the first side;

a thermal substrate via, being of lower thermal resistance than the substrate and being disposed within the substrate, and having a first and second side, the first side being thermally coupled with the semiconductor die; and a heat pipe having an evaporator end and a condenser end, the evaporator end being thermally coupled to the second side of the substrate via by a thermal pathway, the condens or end of said heat pipe being thermally coupled to an antenna.

6. An apparatus as in claim 5, wherein the evaporator end of the heat pipe is coupled indirectly to the second side of the substrate via through a circuit board, the apparatus further comprising:

a circuit board disposed between the second side of the substrate and the evaporator end of the heat pipe;

a circuit board thermal via disposed within the circuit board, the circuit board via having a first side and a second side, the first side of the circuit board via being thermally coupled with the second side of the substrate via; and the heat pipe containing an evaporator end and a condenser end, the evaporator end being thermally coupled to the second side of the circuit board via.

7. An apparatus as in claim 6 wherein the semiconductor die is a power amplifier die.

8. An apparatus as in claim 6 further comprising:

a hot spot area within the semiconductor die;

the semiconductor die being mounted on the substrate in such a manner as to place the hot spot area within the semiconductor die in thermal contact with the first side of the substrate thermal via.

9. An apparatus as in claim 6 wherein the apparatus is contained within a portable communications system containing an antenna, and wherein the condenser end of the heat pipe is in thermal contact with the antenna.

10. An apparatus, contained within a portable communications system containing an antenna, for conducting heat from a semiconductor die mounted on a substrate, the apparatus comprising:

a semiconductor die from which heat is to be conducted;

a substrate for mounting at least one semiconductor die on, the substrate having a first side and a second side, the semiconductor die being coupled to the first side;

a thermal substrate via, being of lower thermal resistance than the substrate and being disposed within the substrate, and having a first and second side, the first side being thermally coupled with the semiconductor die; and a heat pipe having an evaporator end and a condenser end, the evaporator end being thermally coupled to the second side of the substrate via and the condenser end of the heat pipe thermally coupled to the antenna.

11. A method for conducting heat from semiconductors in portable communications equipment having an antenna, the method comprising the steps of:

providing a semiconductor die from which heat is to be conducted;

coupling the semiconductor die to a substrate containing a thermal pathway;

coupling a heat pipe evaporator end to the thermal pathway of the substrate;

conducting heat from the semiconductor die through the thermal pathway into the evaporator end of the heat pipe;

coupling a condenser end of the heat pipe to the antenna; and conducting heat from the condenser end of the heat pipe into the antenna.

12. The method of claim 11 wherein the method further comprises positioning a hot spot on the semiconductor die in thermal contact with the thermal pathway within the substrate in order to maximize the conduction of heat from the hot spot into the thermal pathway within the substrate.

13. An apparatus, within a portable phone having an antenna, for conducting heat from a semiconductor die mounted on a substrate, the apparatus comprising:

a semiconductor die from which heat is to be conducted;

a substrate for mounting at least one semiconductor die on, the substrate having a first side and a second side, the semiconductor die being coupled to the first side;

a thermal substrate via, being of lower thermal resistance than the substrate and being disposed within the substrate, and having a first and second side, the first side of the substrate via being thermally coupled to the semiconductor die;

a circuit board disposed between the second side of the substrate and the evaporator end of the heat pipe;

a circuit board thermal via disposed within the circuit board, the circuit board via having a first side and a second side, the first side of the circuit board via being thermally coupled with the second side of the substrate via;

a the heat pipe having an evaporator end and a condenser end the second side of the circuit board via being coupled to the evaporator end of the heat pipe; and the condenser end of the heat pipe thermally coupled to the antenna.

* * * * *

UNITED STATES PATENT AND TRADEMARK OFFICE
CERTIFICATE OF CORRECTION

PATENT NO.    : 6,134,110
DATED         : October 17, 2000
INVENTOR(S)   : Langari It is certified that error appears in the above-identified patent and that said Letters Patent is hereby corrected as shown below:

Title page,
Item [75], Inventor: Please add as co-inventor the name -- Seyed Hassan Hashemi, Laguna Nigel, Calif. --.

Signed and Sealed this

Twenty-ninth Day of January, 2002

Attest:

Attesting Officer

JAMES E. ROGAN
*Director of the United States Patent and Trademark Office*